(12) United States Patent
Chang et al.

(10) Patent No.: US 7,023,131 B2
(45) Date of Patent: Apr. 4, 2006

(54) ACTIVE MATRIX ORGANIC LIGHT EMITTING DISPLAY AND METHOD OF FORMING THE SAME

(75) Inventors: Shih-Chang Chang, Hsinchu (TW); Hsiu-Chun Hsieh, Changhua (TW); Yaw-Ming Tsai, Taichung Hsien (TW)

(73) Assignee: Toppoly Optoelectronics Corp., Chu-Nan (TW)

( * ) Notice: Subject to any disclaimer, the term of this patent is extended or adjusted under 35 U.S.C. 154(b) by 166 days.

(21) Appl. No.: 10/762,203

(22) Filed: Jan. 20, 2004

(65) Prior Publication Data

US 2004/0169460 A1    Sep. 2, 2004

(30) Foreign Application Priority Data

Jan. 22, 2003    (TW) ............................... 92101326 A

(51) Int. Cl.
*H01J 63/04*    (2006.01)
(52) U.S. Cl. .................. 313/504; 313/506; 313/509
(58) Field of Classification Search .............. 313/498, 313/504, 506, 509
See application file for complete search history.

(56) References Cited

U.S. PATENT DOCUMENTS 5,550,066 A    8/1996    Tang et al.

*Primary Examiner*—Vip Patel
(74) *Attorney, Agent, or Firm*—Liu & Liu

(57) ABSTRACT

An active matrix organic light emitting display and a method of forming the same. The AM-OLED including a substrate with a plurality of thin film transistors serving as driver circuits, a dielectric layer formed conformally on the substrate and the thin film transistors, a first insulating layer formed on parts of the dielectric layer to define the exposed surface of the dielectric layer as a predetermined transparent electrode area, a transparent electrode formed conformally on the predetermined transparent electrode area, a second insulating layer formed on both sides of the transparent electrode to expose parts of surface of the transparent electrode, an organic electroluminescent layer formed on the transparent electrode, and a metal electrode formed on the organic electroluminescent layer. The insulating layer smoothes the transparent electrode surface enhancing the luminescent characteristics of the AM-OLED.

7 Claims, 12 Drawing Sheets

ACTIVE MATRIX ORGANIC LIGHT EMITTING DISPLAY AND METHOD OF FORMING THE SAME

BACKGROUND OF THE INVENTION

1. Field of the Invention

The present invention relates to an active matrix organic light emitting display (AM-OLED) and, more particularly, to an AM-OLED with a dielectric layer under a transparent electrode, improving the surface of the transparent electrode.

2. Description of the Related Art

In accordance with driving methods, an organic light emitting display (OLED) is an active matrix type or a positive matrix type. The active matrix OLED (AM-OLED) is driven by electric currents, in which each of the matrix-array pixel areas has at least one thin film transistor (TFT), serving as a switch, to modulate the driving current based on the variation of capacitor storage potential so as to control the brightness and gray level of the pixel areas.

Concerned with the luminescent principle of the AM-OLED, an electric current is applied to a specific organic lamination to convert electricity to luminescence. The AM-OLED has panel luminescence with thin and lightweight characteristics, spontaneous luminescence with high luminance efficiency and low driving voltage, and advantages of increased view angle, high contrast, high-response speed, full color and flexibility.

Indium tin oxide (ITO) has been widely used as anode electrode material for AM-OLED application because of its transparency, good conductivity, and high work function. Moreover, it is found that the luminescent characteristics of AM-OLED depend strongly on the surface roughness of the anode electrode. The surface roughness of ITO film must be smooth enough to avoid large leakage current or point discharge causing pixel defects.

The average roughness of ITO film formed by sputter deposition is less than 1 nm. Instead of being formed on a smooth glass plate in PM-OLED process, the ITO film is formed on an under-layer in AM-OLED process, wherein the surface roughness of ITO film depends strongly on different under-layers.

Generally, a transparent and insulating organic material is used as the under-layer in conventional AM-OLED process. However, the surface roughness of ITO film on the organic materials is 3~4 times larger than that on a smooth glass plate. The average roughness (Ra) of ITO film on the organic materials is about 3~4nm and such rough surface may result in large leakage current and cause point discharge, such that the luminance efficiency and lifetime of the device are adversely affected.

SUMMARY OF THE INVENTION

An object of the present invention is to provide an active matrix organic light emitting display having a dielectric layer serving as an under-layer of a transparent electrode and a method of forming the same to solve the problems occurring in the prior art.

To achieve the above object, according to the present invention, an active matrix OLED (AM-OLED) comprises a substrate with a plurality of thin film transistors serving as driver circuits, a dielectric layer formed conformally on the substrate and the thin film transistors, a first insulating layer formed on parts of the dielectric layer to define the exposed surface of the dielectric layer as a predetermined transparent electrode area, a transparent electrode formed conformally on the predetermined transparent electrode area and the surrounding surface on the first insulating layer, a second insulating layer formed on both sides of the transparent electrode to expose parts of the transparent electrode, an organic electroluminescent layer formed conformally on the transparent electrode and the second insulating layer, and a metal electrode formed on the organic electroluminescent layer.

In the present invention, the method for forming an active matrix OLED having a dielectric layer serving as an under-layer of a transparent electrode comprises the following steps.

First, a substrate with a plurality of transistors is provided. Next, a dielectric layer is formed conformally on the substrate and the transistors. A first insulating layer is formed on the dielectric layer. A first photoresist layer with an opening is formed and defined on the first insulating layer. Then, the first insulating layer is etched using the first photoresist layer as a mask to expose a part of the dielectric layer. The exposed surface of the dielectric layer serves as a predetermined transparent electrode area. Furthermore, a transparent electrode is formed conformally on the predetermined transparent electrode area. Then, a second insulating layer is formed on both sides of the transparent electrode exposing parts of the transparent electrode. An organic electroluminescent layer is formed conformally on the transparent electrode and the second insulating layer. Finally, a metal electrode is formed on the organic electroluminescent layer.

BRIEF DESCRIPTION OF THE DRAWINGS

The present invention is more fully understood by reading the subsequent detailed description and examples with references made to the accompanying drawings, wherein.

DETAILED DESCRIPTION OF THE INVENTION

Figure 1A:
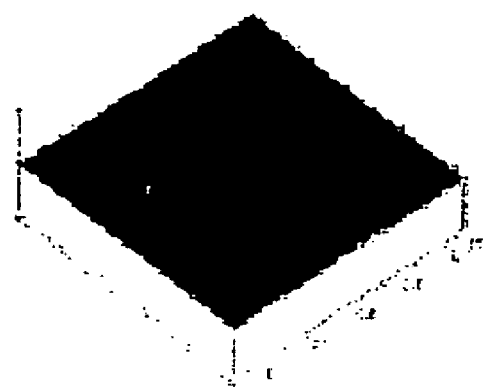
FIGS. 1a to 1e are atomic force microscope (AFM) images showing the surface morphology of ITO film having a thickness of 750 Å formed on different under-layers including glass plate 1a, silicon oxide 1b, silicon nitride 1c, insulating organic material A (PC403, available from JSR) 1d, and insulating organic material B (PC415, available from JSR) 1e.
Figure 1B:
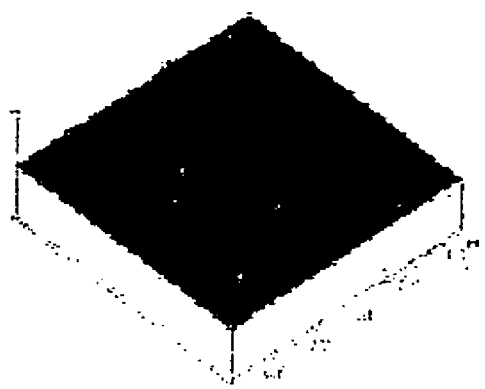
Figure 1C:
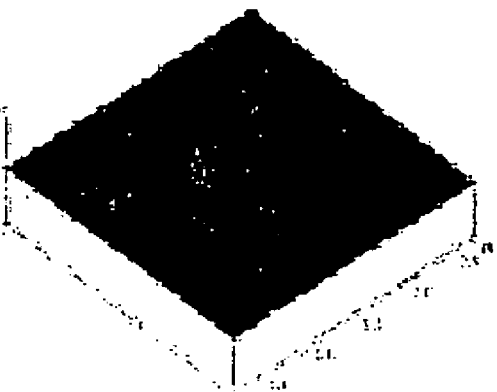
Figure 1D:
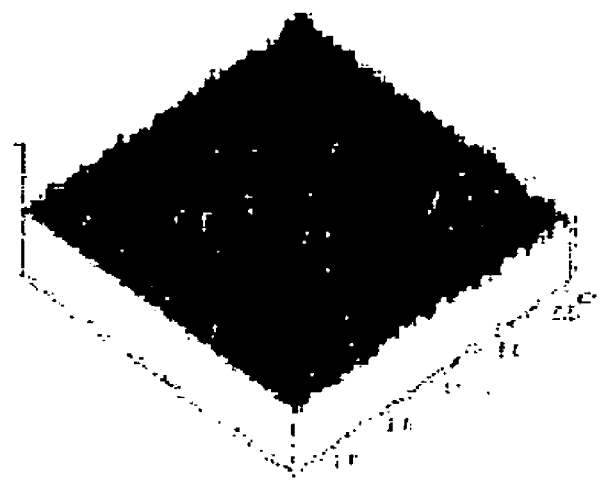
Figure 1E:
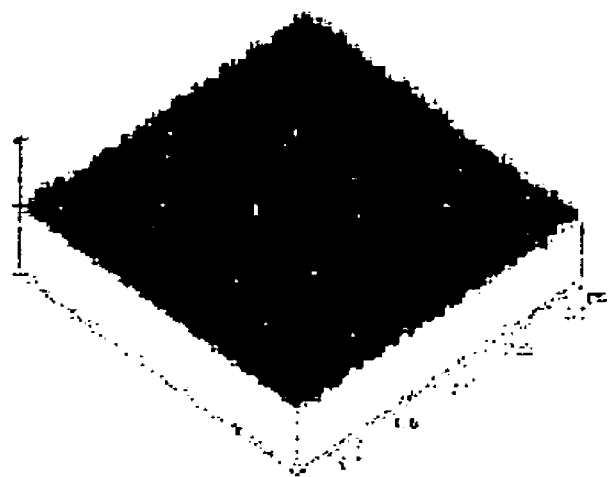
Figure 2A:
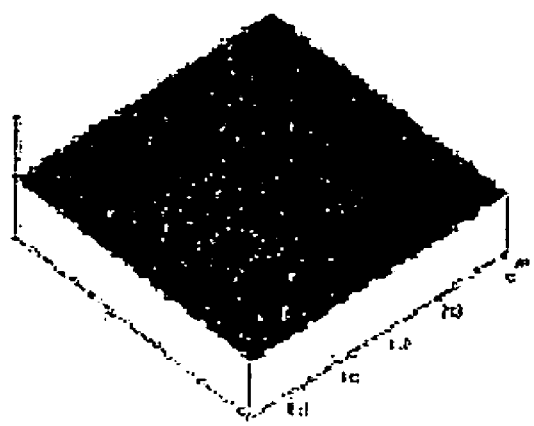
FIGS. 2a to 2e are atomic force microscope (AFM) images showing the surface morphology of ITO film having a thickness of 1500 Å formed on different under-layers including glass plate 2a, silicon oxide 2b, silicon nitride 2c, insulating organic material A (PC403, available from JSR) 2d, and insulating organic material B (PC415, available from JSR) 2e.
Figure 2B:
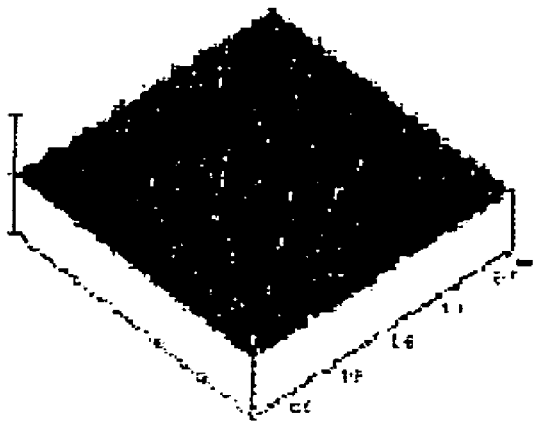
Figure 2C:
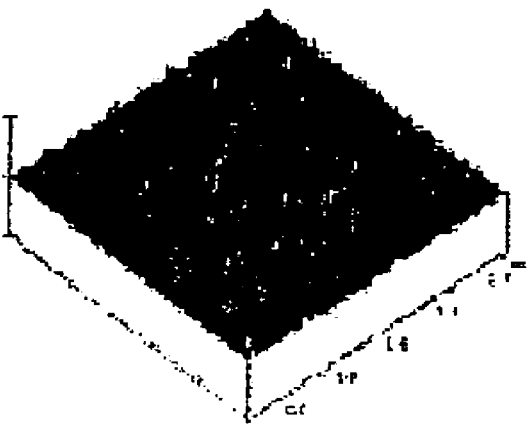
Figure 2D:
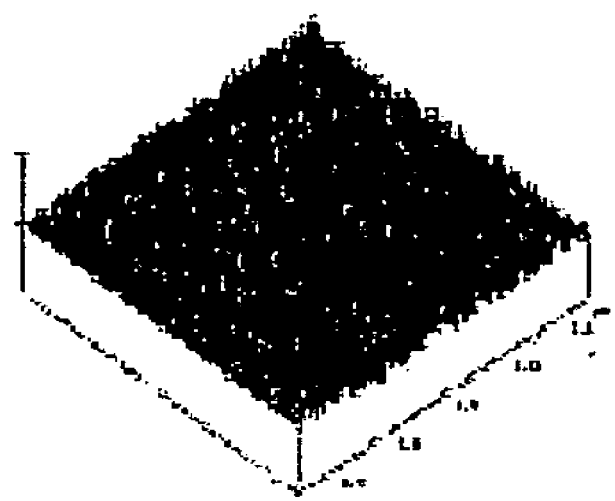
Figure 2E:
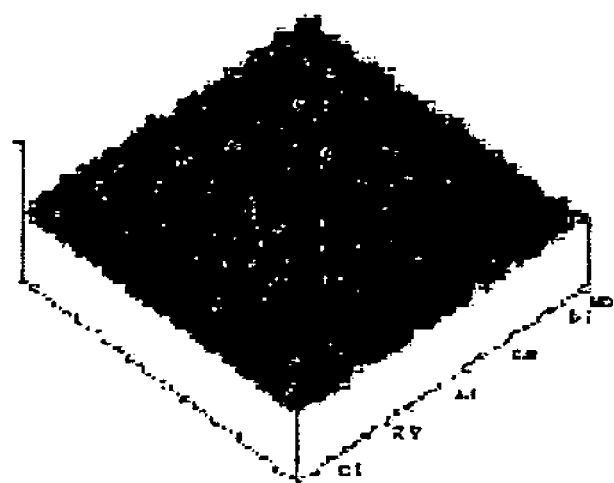
Figure 3A:
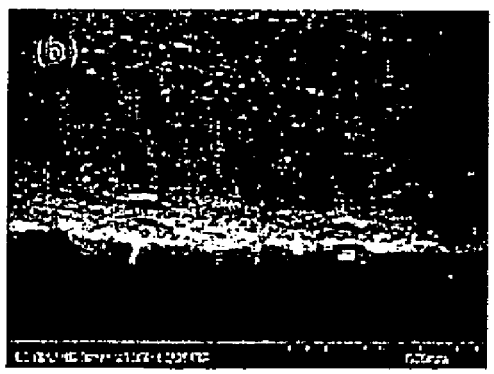
FIGS. 3a to 3e are scanning electron microscope (SEM) photographs showing the surface morphology of ITO film having a thickness of 750 Å formed on different under-layers including glass plate 3a, silicon oxide 3b, silicon nitride 3c, insulating organic material A (PC403, available from JSR) 3d, and insulating organic material B (PC415, available from JSR) 3e.
Figure 3B:
Figure 3C:
Figure 3D:
Figure 3E:
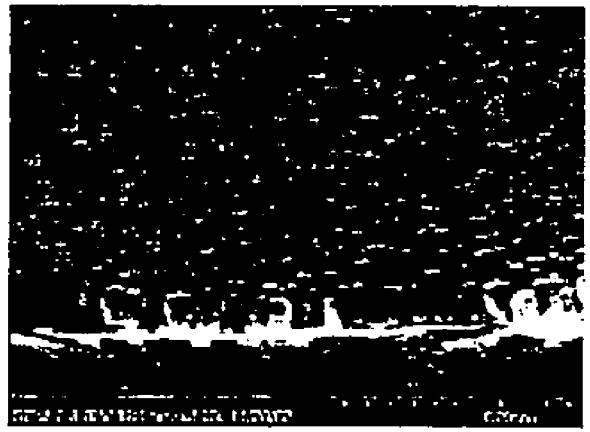
Figure 4A:
FIGS. 4a to 4e are scanning electron microscope (SEM) photographs showing the surface morphology of ITO film having a thickness of 1500 Å formed on different under-layers including glass plate 4a, silicon oxide 4b, silicon nitride 4c, insulating organic material A (PC403, available from JSR) 4d, and insulating organic material B (PC415, available from JSR) 4e.
Figure 4B:
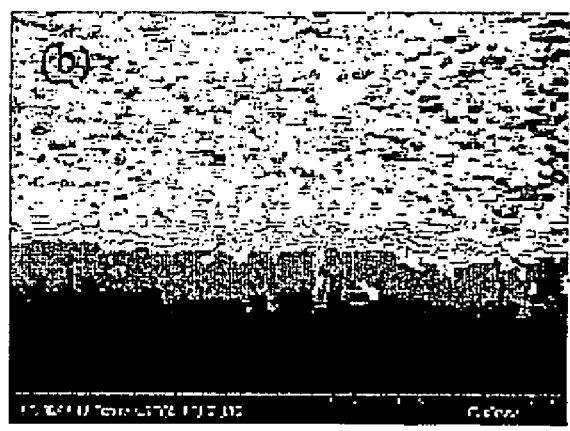
Figure 4C:
Figure 4D:
Figure 4E:

The present invention provide an AM-OLED having a dielectric layer in place of insulating organic material layer serving as an under-layer of a transparent electrode, lowering the average roughness (Ra) of the transparent electrode. Accordingly, the AM-OLED having a smoother transparent electrode surface can prevent large leakage current or point discharge.

The transmittances of ITO film formed on different under-layers are almost the same, compared with ITO film without any under-layer (i.e. ITO deposited on top surface of glass substrates). However, the average roughness (Ra) of ITO film depends strongly on the under-layer material.

ITO film is formed on different under-layers including glass plate, silicon oxide, silicon nitride, insulating organic material A (PC403, available from JSR), and insulating organic material B (PC415, available from JSR) by sputter deposition. The average roughness of ITO film having a thickness of 750 Å with different under-layers are shown in Table 1.

TABLE 1

Average Roughnesss of ITO film having a thickness of 750Å with different under-layers

| Under-layer category | Average roughness (nm) |
|---|---|
| Glass plate | 0.99 |
| Silicon oxide | 0.86 |
| Silicon nitride | 0.61 |
| Organic material A | 3.08 |
| Organic material B | 3.67 |
| Commercial ITO for PMOLED | 0.78 |

Average roughnesss of ITO film having a thickness of 1500 Å with different under-layers are shown in Table 2.

TABLE 2

Average Roughnesss of ITO film having a thickness of 1500Å with different under-layers

| Under-layer category | Average roughness (nm) |
|---|---|
| Glass plate | 1.36 |
| Silicon oxide | 1.47 |
| Silicon nitride | 1.27 |
| Organic material A | 3.42 |
| Organic material B | 3.63 |

From Tables 1 and 2, the average roughness (Ra) of ITO film having a thickness of 750 Å on silicon oxide or silicon nitride as under-layer is 0.61 and 0.86 nm respectively, much less than on insulating organic material used as an under-layer with Ra value over 3 nm.

The average roughness of ITO film having a thickness of 1500 Å with different under-layers produce the same result even though the average roughness of ITO film also depends on the thickness thereof. Accordingly, ITO film formed on dielectric layer is smoother than that formed on insulating organic material layer.

FIGS. 1a to 1e and FIGS. 2a to 2e are atomic force microscope (AFM) images of ITO film formed on different under-layers and thicknesses. The result indicates the surface images of ITO film on dielectric layers are similar to ITO film without under-layers. On the other hand, the images of ITO film on insulating organic material layers show a much rougher morphology.

The surface morphology of ITO film formed on different under-layers is further verified by scanning electron microscope (SEM) analysis as shown in FIGS. 3a to 3e and FIGS. 4a to 4e. This shows consistently that the morphology of ITO film is improved by the dielectric layers serving as an under-layer of the transparent electrode, compared. with insulating organic material layers.

Based on the disclosed results, a new pixel structure having a dielectric layer as an under-layer of a transparent electrode is provided by the present invention to improve luminescent characteristics of AM-OLED.

The following embodiment is intended to illustrate the invention more fully without limiting its scope, since numerous modifications and variations will be apparent to those skilled in this art.

FIGS. 5a to 5f are cross-sections illustrating the process flow of forming an AM-OLED according to a preferred embodiment of the present invention.

Figure 5A:
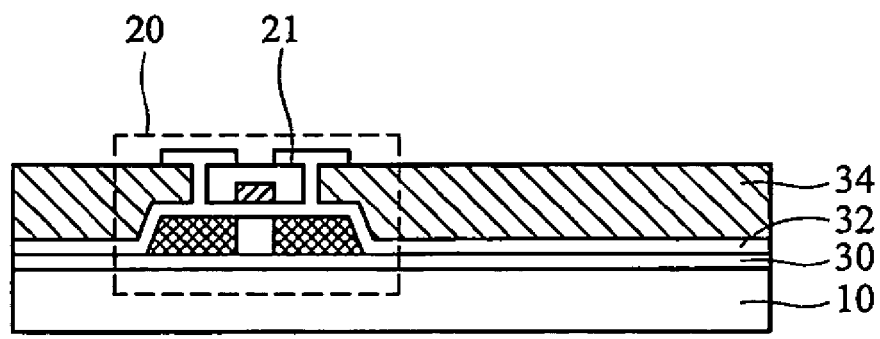
FIGS. 5a to 5f are cross-sections illustrating the process flow of pixel structure formation for the organic light emitting display according to a preferred embodiment of the present invention.

First, referring to FIG. 5a, a substrate 10 having a plurality of transistors 20, a gate oxide layer 32, and a buffer layer 30 is provided. The transistor 20 acts as a driver circuit for AM-OLED. Next, a dielectric layer 34 is formed conformally on the buffer layer 30 and the transistor 20 by sputtering, physical vapor deposition (PVD), or plasma enhanced chemical vapor deposition (PECVD). Preferably, the substrate 20 is a transparent insulating material such as glass substrate, plastic substrate, or ceramic substrate. The plastic substrate is polyethylene terephthalate, polyester, polycarbonates, polyacrylates, or polystyrene. To meet the requirements of AM-OLED, the use of thin film transistor (TFT) is preferable, such as amorphous-silicon thin film transistor (a-Si:H TFT), low temperature poly-silicon thin film transistor (LTPS-TFT), or organic thin film transistor (OTFT). Suitable material for the dielectric layer 34 is insulating oxide, nitride, carbide or combinations thereof, such as silicon nitride, silicon oxide, aluminum oxide, magnesium oxide, aluminum nitride or magnesium fluoride.

Figure 5B:
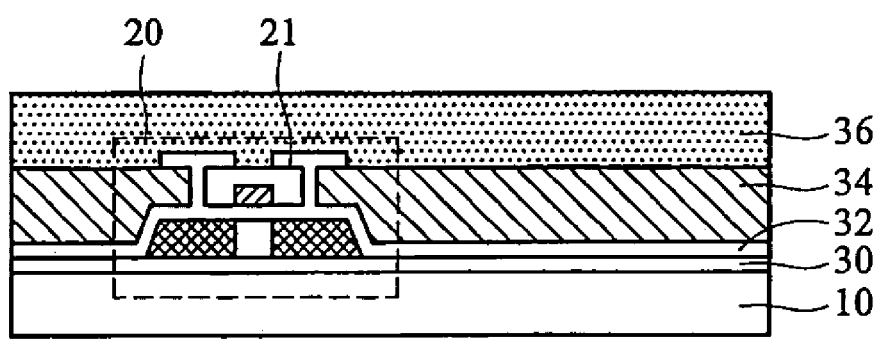

Subsequently, referring to FIG. 5b, a first insulating layer 36 is formed conformally on the dielectric layer 34 and electrodes of the transistor 20. Preferably, the material of the first insulating layer 36 is insulating organic material, such as acrylic resin, polyimide, or energy-curable resist.

Figure 5C:
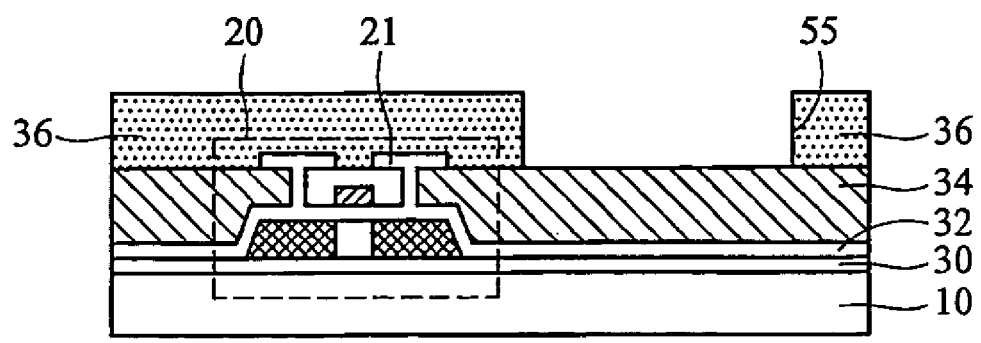

Subsequently, referring to FIG. 5c, a first photoresist layer with an opening is formed and defined on the first insulating layer 36. The first insulating layer 36 is etched using the first photoresist layer as a mask, with the dielectric layer 34 acting as an etch stopper. A first insulating layer opening 55 is formed to expose a part of the dielectric layer 34 by etching the first insulating layer 36. A predetermined transparent electrode area is constructed of the first insulating layer opening 55 and the exposed surface of dielectric layer 34. The process of etching the first insulating layer 36 uses wet etching or dry etching.

Figure 5D:
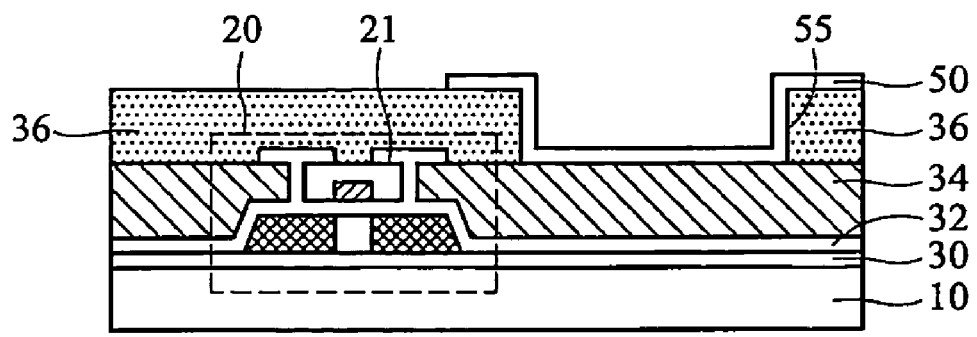

Subsequently, referring to FIG. 5d, a transparent electrode 50 serving as the anode electrode of OLED is formed on the predetermined transparent electrode area and the surrounding surface on the first insulating layer 36. Suitable material for the transparent electrode 50 is transparent metal or metal oxide, such as indium tin oxide (ITO), indium zinc oxide (IZO), aluminum zinc oxide (AZO), or zinc oxide (ZnO). Preferably, the transparent electrode 50 is formed by a method such as sputtering, electron beam evaporation, thermal evaporation, or chemical vapor deposition.

Figure 5E:
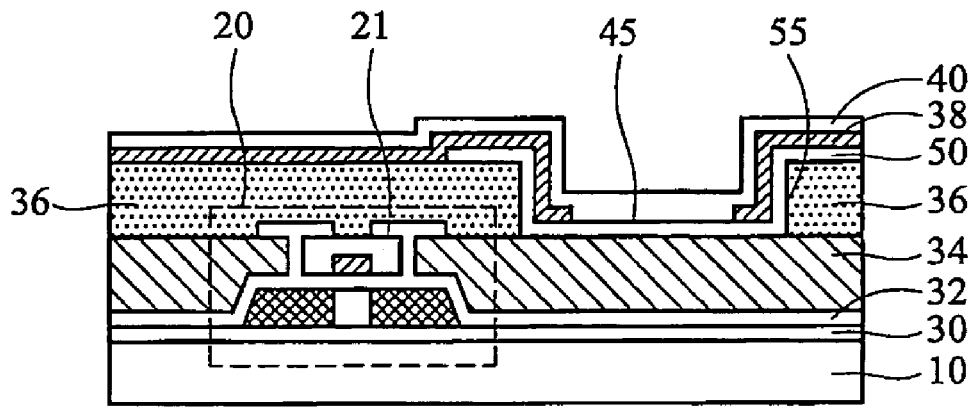

Subsequently, referring to FIG. 5e, a second insulating layer 38 is formed conformally on the transparent electrode. Next, using photolithography and etching with a second resist pattern, the second insulating layer 38 is patterned to expose parts of surface 45 of the transparent electrode. Then, an organic electroluminescent layer 40 is formed conformally on the second insulating layer 38 and the exposed surface 45 of the transparent electrode 50. Preferably, the organic electroluminescent layer 40 is organic semiconductor material, such as small molecule material, polymer, or organo-metallic complex. The organic electroluminescent layer 40 is formed by thermal vacuum evaporation, spin coating, dip coating, roll-coating, injection-fill, embossing, stamping, physical vapor deposition, or chemical vapor deposition.

Figure 5F:
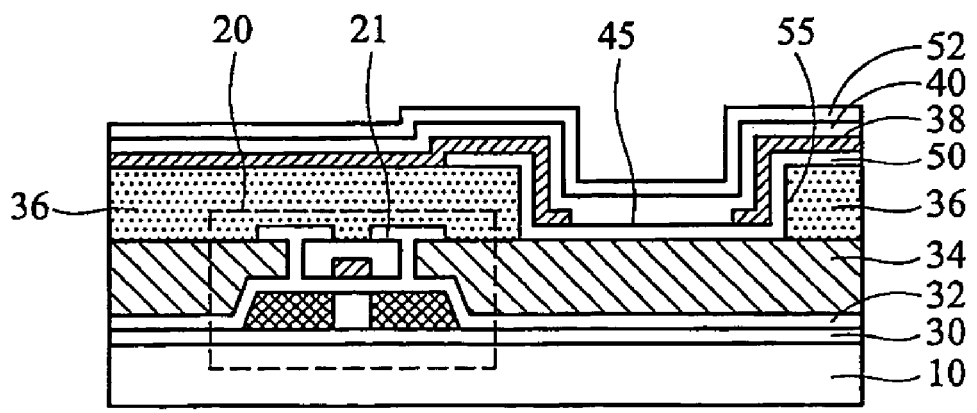

Finally, referring to FIG. 5f, a metal electrode 52 serving as the cathode electrode of OLED is formed on the entire surface of the organic electroluminescent layer 40 by sputtering or evaporation. To meet the requirements of cathode of OLED, material capable of injecting electrons into organic electroluminescent is preferable, for example, low work function material such as Ca, Ag, Mg, Al, Li, or alloys thereof.

Figure 6:
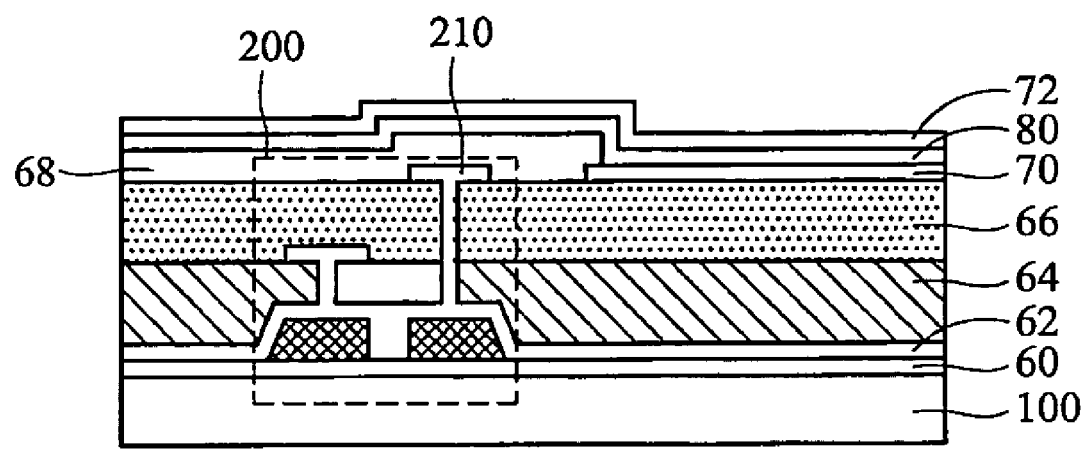
FIG. 6 is a cross-section illustrating conventional pixel structure of the active matrix OLED.

In conventional AM-OLED process, a transparent electrode is formed directly on an insulating organic material. FIG. 6 shows a cross-section of conventional AM-OLED structure. In order to determine the difference between the two, AM-OLED devices with different insulating organic materials (including insulating organic material A (PC403, available from JSR) and insulating organic material B (PC415, available from JSR)) as under-layers of the transparent electrode are also manufactured, and the luminance efficiency of each is measured.

The luminance efficiency of an AM-OLED device having the dielectric layer (silicon oxide) as the under-layer of the transparent electrode is about 17.2 $Cd/m^2$. It is almost the same as the luminance efficiency (17.6 $Cd/m^2$) of PM-OLED having a smooth glass plate as under-layer of the transparent electrode. Compared with the luminance efficiency of AM-OLED devices having the insulating organic material layer as under-layer, the luminance efficiency of AM-OLED devices having the dielectric layer as under-layers is obviously higher.

Figure 7:
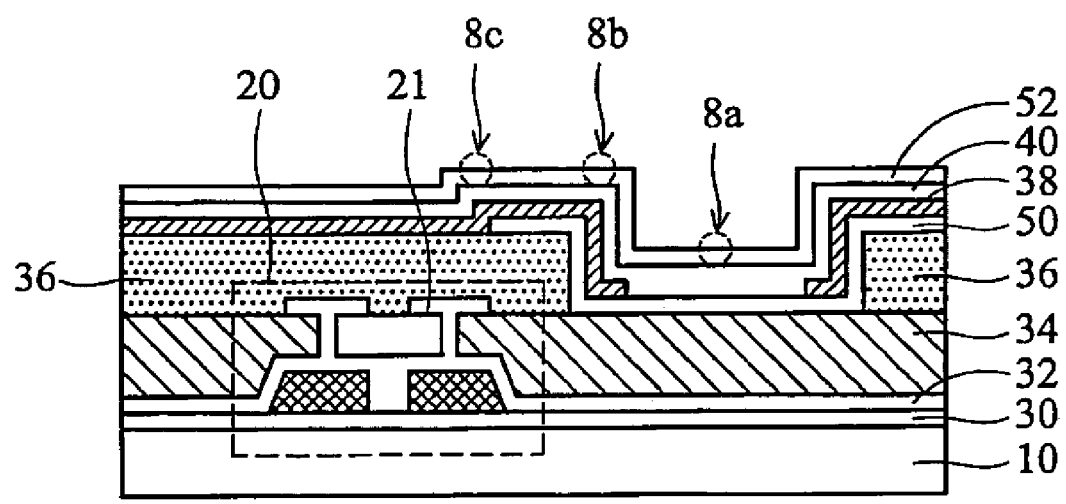
FIG. 7 is a cross-section illustrating a pixel structure of the active matrix OLED according to a preferred embodiment of the present invention.
Figure 8A:
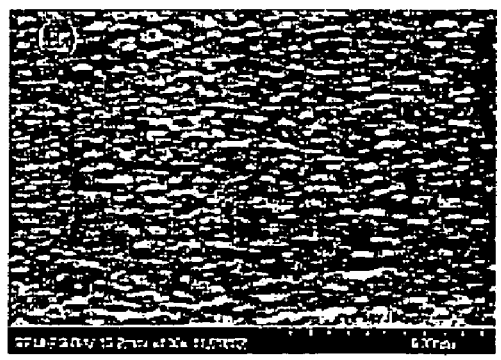
FIG. 8a is a scanning electron microscope (SEM) photograph showing the surface morphology of location 8a shown in FIG. 7.
Figure 8B:
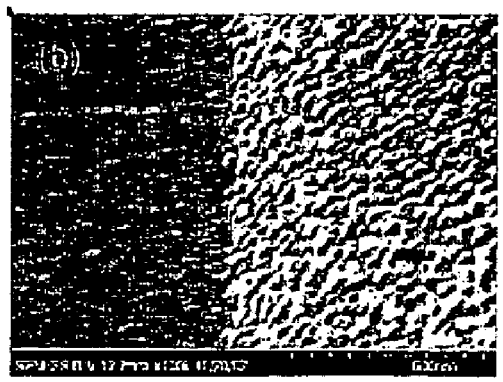
FIG. 8b is a scanning electron microscope (SEM) photograph showing the surface morphology of location 8a shown in FIG. 7.
Figure 8C:
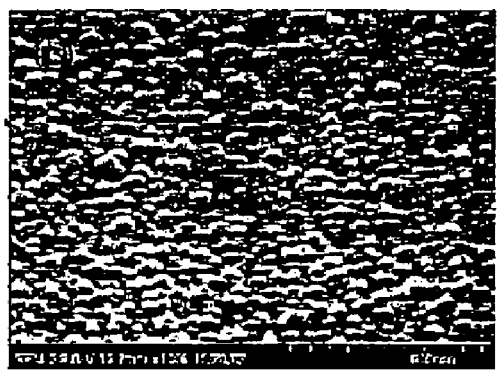
FIG. 8c is a scanning electron microscope (SEM) photograph showing the surface morphology of location 8a shown in FIG. 7.

FIGS. 8a to 8c are scanning electron microscope (SEM) images of different locations of the structure shown in FIG. 7. Accordingly, the morphology of the metal electrode surface 8a with the dielectric under-layer is flattest among those.

In conclusion, the present invention removes a part of the insulating organic material layer by etching to contact the, transparent electrode directly with the dielectric layer. The surface roughness of the transparent electrode is thus significantly reduced, and therefore the luminance efficiency and reliability of the OLED devices are improved. Furthermore, the pixel structures provided by the present invention prevent current leakage or point discharge, thus avoiding damage to the AM-OLED devices.

Although the present invention has been described in its preferred embodiments, it is not intended to limit the invention to the precise embodiments disclosed herein. Those who are skilled in the art can still make various alterations and modifications without departing from the scope and spirit of this invention. Therefore, the scope of the present invention shall be defined and protected by the following claims and their equivalents.

What is claimed is:

1. A self-sustained atmospheric pressure system for absorbing or scattering electromagnetic waves, comprising:
   an electromagnetic source for producing electromagnetic waves;
   a plasma panel disposed to receive incident thereon electromagnetic waves produced by the electromagnetic source, the plasma panel comprising:
      a first dielectric having at least one capillary defined therethrough;
      a segmented electrode disposed proximate and in fluid communication with the at least one capillary;
      a second electrode having a first surface disposed closest towards the first dielectric and an opposite second surface, the second electrode being separated a predetermined distance from the first dielectric, the first surface of the second electrode being coated with a second dielectric layer, the assembled second electrode and second dielectric layer having at least one opening defined therethrough;
   a power supply electrically connected to the plasma panel, the power supply being turnable on and off, a non-thermal plasma being generated between the first dielectric and second dielectric only while the power supply is on; and
   a detector for receiving scattered electromagnetic waves reflected off of the plasma panel.

2. The system in accordance with claim 1, wherein the plasma is substantially uniform and the plasma panel absorbs substantially all incident electromagnetic waves.

3. The system in accordance with claim 1, wherein the plasma is non-uniform and the plasma panel reflects at least some of the incident electromagnetic waves.

4. The system in accordance with claim 3, wherein the electromagnetic source emits multiple wavelength electromagnetic waves, and the plasma panel scatters waves reflected from its surface in different directions according to their respective individual wavelengths.

5. The system in accordance with claim 4, wherein the degree of separation between the various wavelength components depends on arrangement of and spacing between the capillaries.

6. The system in accordance with claim 1, wherein the opening and capillaries are arranged substantially concentric with one another.

7. The system in accordance with claim 1, wherein the diameter of the capillary is greater than the diameter of its associated opening.

* * * * *